Figure 1:
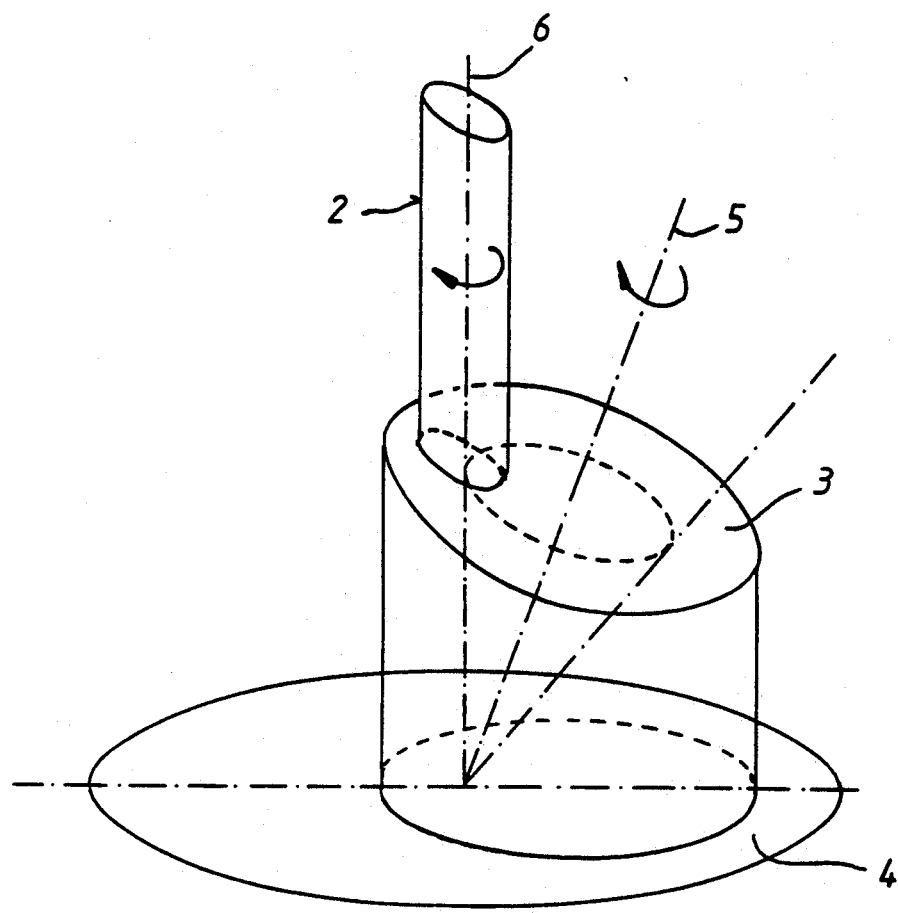
Figure 1:
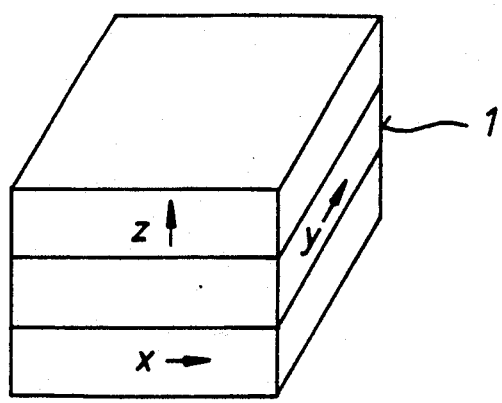
Figure 2:
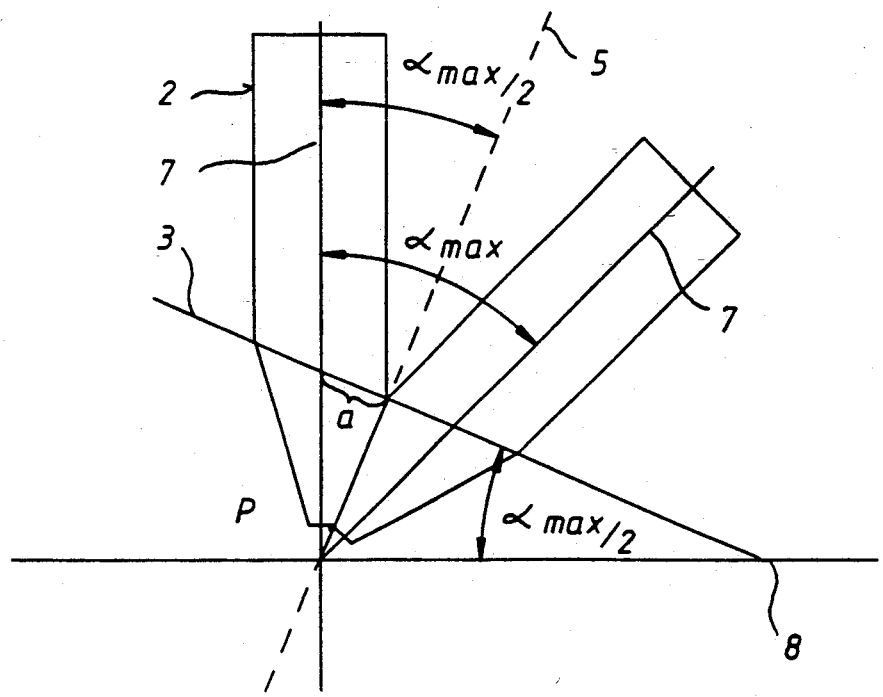

United States Patent [19]

Feuerbaum

[11] Patent Number: 5,329,125

[45] Date of Patent: Jul. 12, 1994

[54] DEVICE FOR CORPUSCULAR-OPTICAL EXAMINATION AND/OR PROCESSING OF MATERIAL SAMPLES

[75] Inventor: Hans-Peter Feuerbaum, Munich, Fed. Rep. of Germany

[73] Assignee: ICT Integrated Circuit Testing Gesellschaft fur Halbleiterpruftechnik, mbH, Fed. Rep. of Germany

[21] Appl. No.: 974,267

[22] Filed: Nov. 10, 1992

[30] Foreign Application Priority Data

Dec. 10, 1991 [DE] Fed. Rep. of Germany ....... 4140710

[51] Int. Cl.⁵ .............................................. H01J 37/20
[52] U.S. Cl. ................................................. 250/442.11
[58] Field of Search ..................... 250/440.11, 441.11, 250/442.11

[56] References Cited

U.S. PATENT DOCUMENTS

| | | | |
|---|---|---|---|
| 3,086,112 | 4/1963 | Riecke | 250/442.11 |
| 3,629,577 | 12/1971 | Karlsruhe et al. | 250/442.11 |
| 4,460,827 | 7/1984 | Onoguchi et al. | 250/310 |
| 4,627,009 | 12/1986 | Holmes et al. | 250/442.11 |
| 5,229,607 | 7/1993 | Matsui et al. | 250/306 |

*Primary Examiner*—Bruce C. Anderson
*Attorney, Agent, or Firm*—Learman & McCulloch

[57] ABSTRACT

The invention relates to a device for corpuscular-optical examination and/or processing of material samples in which the column and the table system are rotatable relative to one another about a first axis of rotation which encloses a specific angle of inclination with a perpendicular to the object plane, the column being arranged in such a way that its optical axis forms the same angle of inclination with the first axis of rotation. A device of this type is distinguished over known constructions by a substantially simpler construction.

5 Claims, 5 Drawing Sheets

DEVICE FOR CORPUSCULAR-OPTICAL EXAMINATION AND/OR PROCESSING OF MATERIAL SAMPLES

The invention relates to a device for corpuscular-optical examination and/or processing of material samples, containing
- a) a corpuscular-optical column for producing a corpuscular beam,
- b) as well as a table system which receives the material sample and by means of which the material sample can be displaced in at least two axes (x, y) which are at right angles to each other, and furthermore there exists between the column and the material sample a relative rotatability about at least one axis of rotation.

In the semiconductor industry wafers and other material samples are examined from several points of view and processed with the aid of scanning electron microscopes, ion beam probes and ion beam repair devices. For this purpose table systems are required which can accurately position the material sample in five axes (three axes for longitudinal displacement and two axes of rotation) to a few μm. As the material samples increase in size, the table systems and the appertaining vacuum chambers become ever more expensive in order for example to compensate for bending of the material. Therefore the conventional table and chamber systems become disproportionately more expensive with the increasing size of the material samples.

The object of the invention is to create a device of the type referred to in the introduction for corpuscular-optical examination and/or processing of material samples which—whilst retaining the necessary positioning possibilities—is distinguished by a substantially simpler construction.

This object is achieved according to the invention by the following features:

The column and the table system are rotatable relative to one another about a first axis of rotation which with a perpendicular to the plane formed by the x and y axes encloses an angle of inclination ($\alpha_{max}/2$) of a maximum of 45° and passes through the place to be examined or to be processed on the material sample;

the column is also arranged in such a way that its optical axis forms the aforementioned angle of inclination ($\alpha_{max}/2$) with the first axis of rotation and passes through the place to be examined or to be processed on the material sample.

Whereas in the previously known constructions all positioning possibilities (in three longitudinal axes and two axes of rotation) are provided by the correspondingly constructed table system, according to the invention the positioning system is divided. In a preferred variant the x, y and z displacement is produced by the table system, whilst the tilting and rotation is produced by the corpuscular-optical column.

In this way a table system is produced which is of substantially simpler construction and in which the necessary stability can be achieved by considerably lower expenditure on construction. Furthermore, by means of the division of the positioning system according to the invention the vacuum chamber for the table system can in particular be kept smaller.

It is also advantageous that a device according to the invention can be adapted very well to the particular purpose by replacement of the relatively simple table system.

Advantageous constructions of the invention are the subject matter of the subordinate claims and are explained in connection with the following description of one embodiment.

In the drawings:

FIG. 1 shows a schematic representation of one embodiment of the device according to the invention, FIGS. 2 to 8 show diagrammatic representations of the mathematical relationships.

The scanning electron microscope which is shown quite schematically in FIG. 1 contains a table system 1 which receives the material sample (wafer) to be examined and which permits displacement of the material sample in three axes (s, y, z) which are at right angles to one another.

An electron microscope column 2 is arranged inclined at a specific angle on a base plate 3 which in turn is inclined by the same angle relative to a rotating disc 4. The base plate 3 with the column 2 is rotatable about a first axis of rotation 5. The base plate 3 with the column 2 is also rotatable by means of the rotating disc 4 about the second axis of rotation 6.

By rotation of the base plate 3 about the first axis of rotation 5 the angle at which the electron microscope column 2 views the material sample is altered. The rotation of the rotating disc 4 also facilitates turning of the tilted column 2 with respect to the material sample, as will be explained in greater detail with the aid of FIGS. 2 to 8.

First of all the mathematical relationships for the tilting of the column 2 will be set out with the aid of FIGS. 2 to 5. It may be assumed that the column 2 is to be tilted about an angle of tilt $\alpha$, the maximum angle of tilt being designated by $\alpha_{max}$. For this purpose the column 2 is constructed on the base plate 3 in such a way that its optical axis 7 encloses an angle of inclination $\alpha_{max}/2$ with the first axis of rotation 5. Furthermore the column 2 is arranged in such a way that its optical axis runs through the place on the material sample (point P in the x, y object plane 8) which is to be examined or to be processed. The base plate 3 is inclined at the same angle $\alpha_{max}/2$ with respect to the x, y object plane 8.

Thus the column 2 and the table system (which is not shown in FIG. 2) are rotatable relative to one another about the first axis of rotation 5. With a perpendicular to the plane (x, y object plane 8) formed by the x, y axes this first axis of rotation 5 encloses the angle of inclination $\alpha_{max}/2$. If the base plate 3 is rotated about the first axis of rotation 5, then the column 2 carries out a tumbling movement. In this case its optical axis 7 describes a conical surface. The position of the apex of the cone can be moved by the choice of the distance a on the first axis of rotation 5. The position of the apex of the cone defines the eucentric working point and thus the working distance of the device. The x, y object plane 8 must pass through the apex of the cone.

The relationship between the angle of tilt $\alpha$ of the optical axis and the angle of rotation $\delta$ about the first axis of rotation will be explained with the aid of FIGS. 3 to 5.

Figure 3:
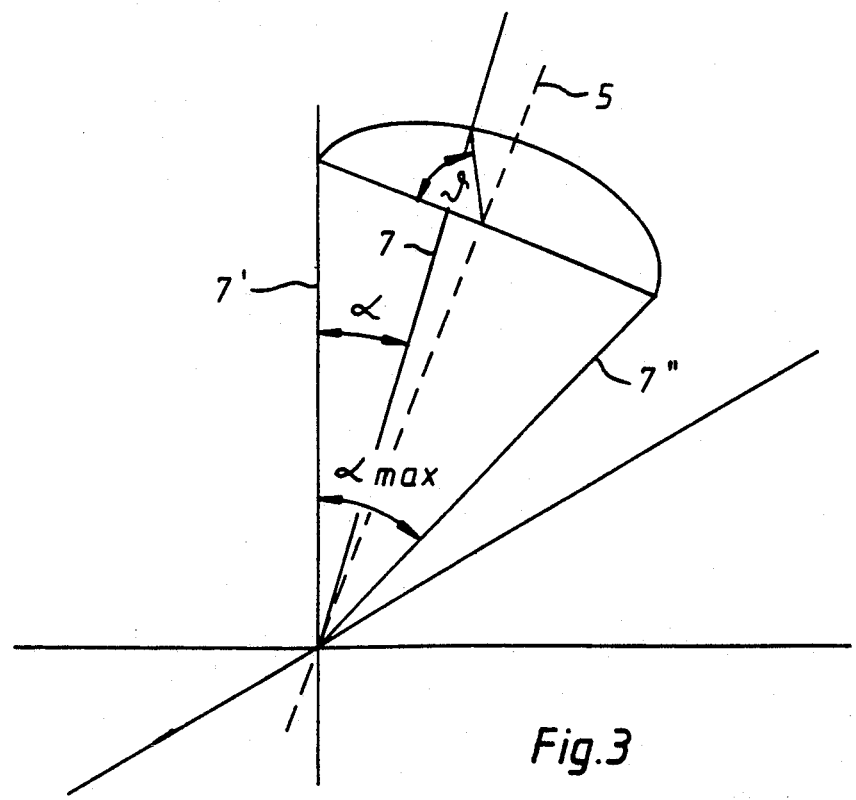
Figure 4:
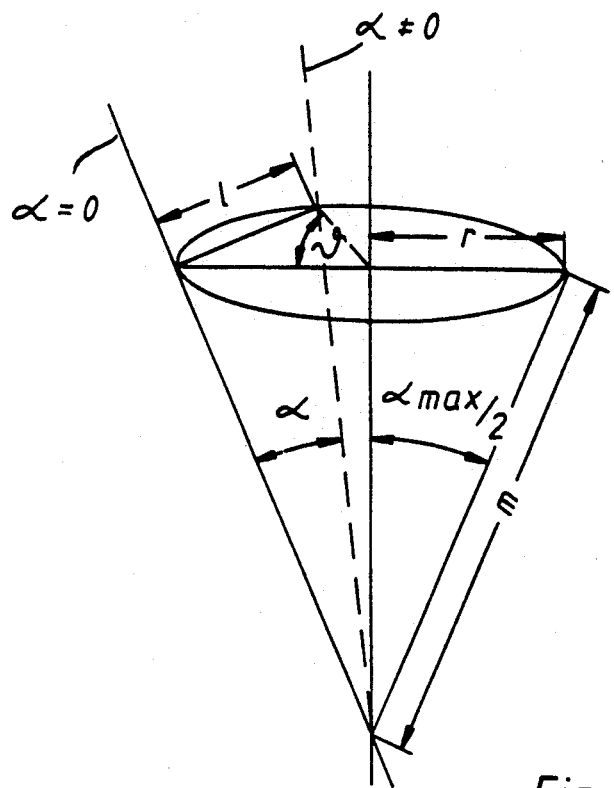

FIG. 3 shows the starting position 7', the end position 7" and an intermediate position 7 of the optical axis during its tilting movement about the first axis of rotation 5. In the intermediate position 7 the angle of tilt is designated by $\alpha$ and the angle of rotation by $\delta$.

In determining the function $\alpha(\delta)$ the angle of tilt is advantageously placed vertically on the apex (FIG. 4) and the base of the cone is viewed from above. Then using the symbols shown in FIG. 4 the following relationships are produced:

$$\sin \alpha_{max}/2 = r/m \qquad (1)$$

$$l^2 = 2m^2(1 - \cos \alpha) \qquad (2)$$

$$l^2 = 2r^2(1 - \cos \delta) \qquad (3)$$

It follows from (1), (2) and (3) that $$\alpha = 2 \arcsin (\sin \alpha_{max}/2 \cdot \sin \delta/2) \qquad (4)$$

Figure 5:
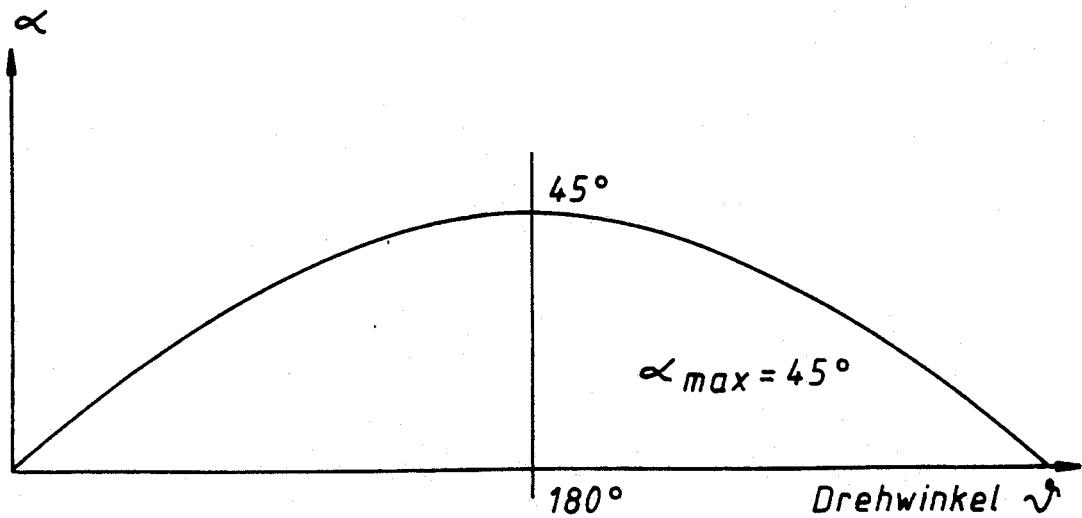

FIG. 5 shows the course of this function, which is graphically clear in principle: for a small angle of rotation $\delta$ the optical axis is removed virtually radially out of the starting position. On the other hand, if $\delta$ comes close to 180°, then the axis tends towards the maximum tilting, so the movement is tangential; the angle of tilt does not alter significantly, and therefore the function runs approximately horizontally.

The tumbling movement of the column 2 about the first axis of rotation 5 which is explained above can be compensated for by the additional rotation of the column 2 about the second axis of rotation 6.

Figure 6:
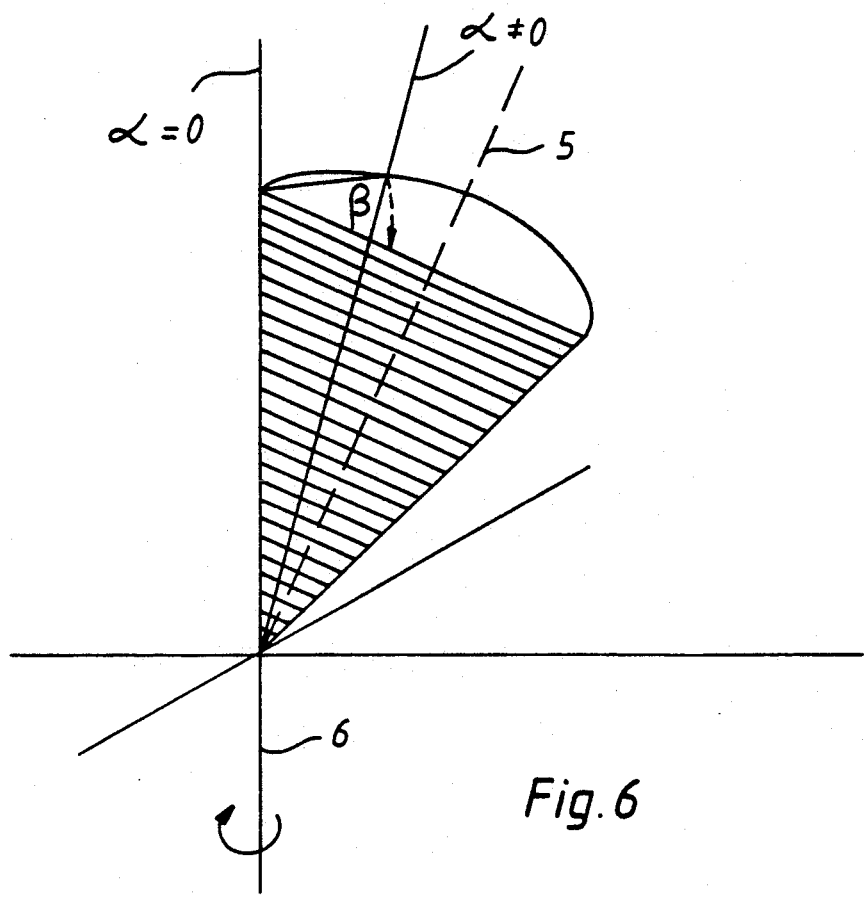
Figure 7:
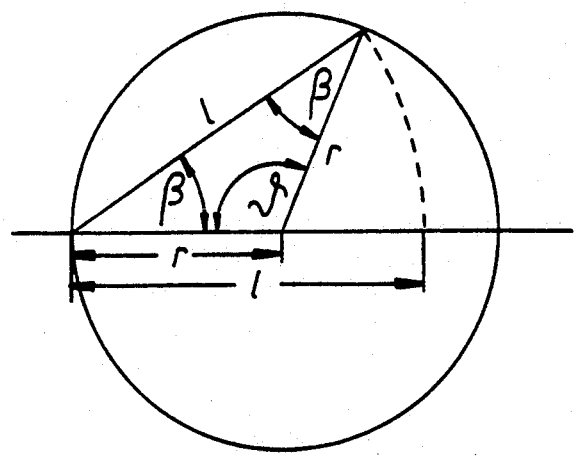

FIGS. 6 and 7 show this in schematic form.

The purpose of the measure is to keep the optical axis 7 of the column always in the hatched plane (i.e. in a plane at right angles to the x-y axis) even during a tilting movement (rotation about the first axis of rotation 5). For this purpose the entire arrangement must be rotated about the starting position of the optical axis, i.e. about the second axis of rotation 6 which is shown in FIG. 1 and which coincides with the optical axis 7 of the column in the starting position ($\alpha=0$).

FIG. 7 shows how the rotation must be carried out:

$$2\beta = 180° - \delta \qquad (5).$$

From this it follows that $$\beta = 90° - \delta/2 \qquad (6).$$

Therefore, in order to equalise the tumbling movement a control arrangement is provided according to the invention by means of which the relative rotation between the column and the table system about the first axis of rotation 5 (angle of rotation $\delta$) and the relative rotation between the column and the table system about the second axis of rotation 6 (angle of rotation $\beta$) take place in accordance with the equation $\beta = 90° - \delta/2$ in such a way that the optical axis of the column moves in a plane standing perpendicular on the x-y axis in the event of an alteration in the angle $\alpha$ formed between the optical axis of the column and the second axis of rotation 6.

Figure 8:
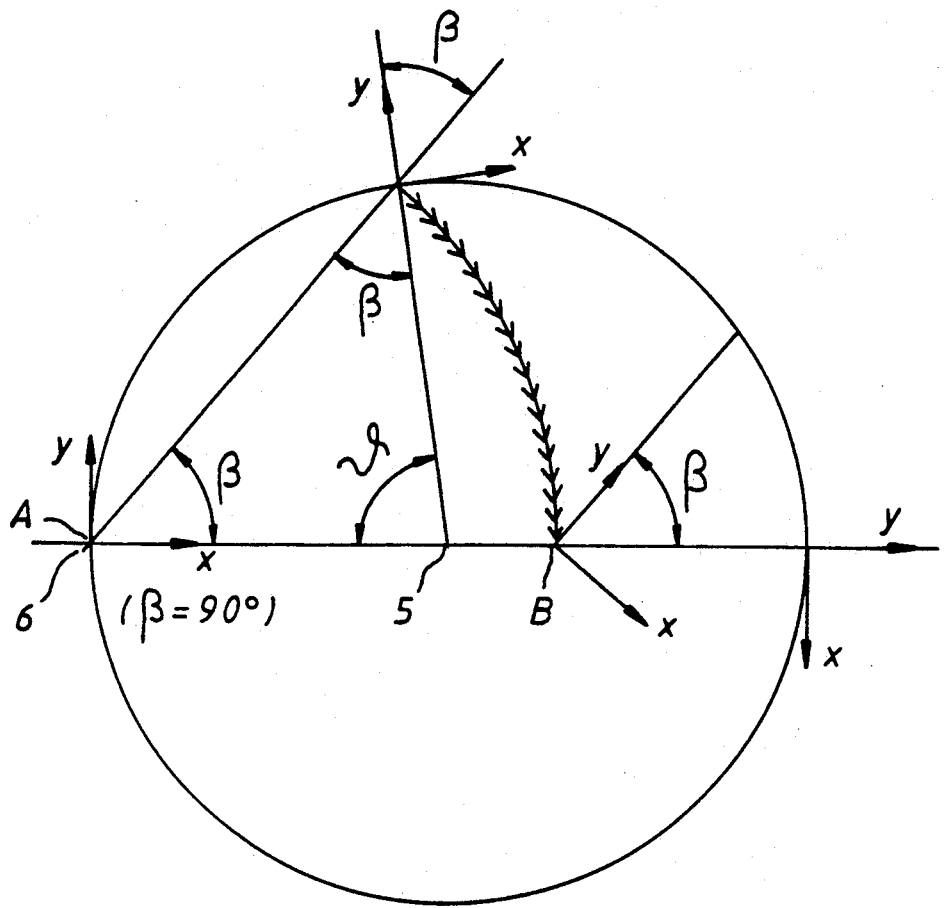

An equalisation of the scan rotation, as explained with the aid of FIG. 8, is also advantageous.

During its tilting movement (i.e. during the rotation about the first axis of rotation 5), the electron microscope column simultaneously rotates about its own axis. Since the arrangement for deflecting the corpuscular beam along two axes standing at right angles to one another (the so-called scan system) is oriented fixed with respect to the optical axis, it rotates with it so that the image on the monitor rotates. This is advantageously compensated for by an opposite scan rotation.

FIG. 8 shows how the scan system moves when the column is rotated about the angle $\pi$—based on the first axis of rotation 5—and for the purpose of tumbling equalisation about the angle $\beta$—based on the second axis of rotation 6—out of the starting position A into the end position B.

A study will show that the y axis of the scan system always encloses the angle $\beta = 90° - \delta/2$ with the direction of tilt. Thus if the alignment of the scan system is to remain constant, in the event of a relative rotation of the column and the table system about the second axis of rotation 6 (angle of rotation $\beta$) the scan system must be rotated back by the angle $90° - \beta$ counter to this rotation.

In the preceding description of one embodiment it was assumed that the table system is movable along three axes x, y and z which are at right angles to one another, while the column is rotatable about two axes of rotation 5, 6.

However, within the scope of the invention it is also possible to provide the relative movements in other ways. For example the column could be rotatable only about one axis of rotation and the table system could be rotatable about the other axis of rotation. It is also conceivable for the rotary movement about both axes of rotation to be assigned to the table system. Finally, within the scope of the invention it is also possible for the longitudinal displacement in the z direction to be carried out by the column.

I claim:

1. In a device for corpuscular-optical examination and processing of material samples, said device comprising a corpuscular-optical column for producing a corpuscular beam, a table system which mounts the material sample including a displacement mechanism by which the material sample can be displaced in at least two axes (x, y) which are at right angles to each other, the improvement wherein:

the column and table system are rotatable relative to one another about a first axis of rotation which is at a first selected angle from the axis that is perpendicular to the plane formed by the x and y axes, said angle being no greater than 45°;

said first axis of rotation passes through the place to be examined or to be processed on the material sample; and the column being aligned so that its optical axis intersects said first axis of rotation at the place to be examined or to be processed on the material sample at a second angle equal in magnitude to said first selected angle and the rotation of the column about the first axis of rotation forms a conical surface centered about said first axis of rotation.

2. The device as claimed in claim 1, characterized in that the column and the table system are additionally rotatable relative to one another about a second axis of rotation which is perpendicular to the plane by the x, y axes, said second axis of rotation passing through the place on the material sample to be examined or to be processed and intersecting said first axis of rotation and said optical axis.

3. The device as claim 2, characterised by a control arrangement by means of which the relative rotation between the column and the table system about the first axis of rotation (angle of rotation $\delta$) and the relative rotation between the column and the table system about the second axis of rotation (angle of rotation $\beta$) take place in accordance with the equation $$\beta = 90° - \delta/2$$

in such a way that the optical axis of the column moves in a plane standing perpendicular on the x-y axes in the event of an alteration in the angle of tilt ($\alpha$) formed between the optical axis of the column and the second axis of rotation.

4. The device as claimed in claim 3 with an arrangement for deflecting the corpuscular beam along two axes (x, y) standing at right angles to one another, characterised by a control arrangement by means of which, in the event of a relative rotation between the column and the table system about the second axis of rotation (angle of rotation $\beta$), the axes (x, y) of the beam deflection are rotated back by the angle $90° - \beta$ counter to this rotation.

5. The device as claimed in claim 1, characterised in that the column and the table system are also movable relative to one another in a z axis which is perpendicular to the x, y axes.

* * * * *